United States Patent
Wong

(10) Patent No.: US 7,636,562 B1
(45) Date of Patent: *Dec. 22, 2009

(54) RADIO FREQUENCY MIXER AND METHOD OF OPERATION

(75) Inventor: Hee Wong, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 679 days.

This patent is subject to a terminal disclaimer.

(21) Appl. No.: 11/027,772

(22) Filed: Dec. 31, 2004

Related U.S. Application Data

(63) Continuation of application No. 09/862,048, filed on May 21, 2001, now Pat. No. 6,839,551.

(51) Int. Cl.
*H04B 1/10* (2006.01)
*H04B 1/26* (2006.01)

(52) U.S. Cl. .................. 455/296; 455/283; 455/302; 455/314; 455/323; 455/337

(58) Field of Classification Search .............. 455/232.1, 455/234.1, 239.1, 245.1, 250.1, 251.1, 283–286, 455/296, 302–326, 337
See application file for complete search history.

(56) References Cited

U.S. PATENT DOCUMENTS

| | | | |
|---|---|---|---|
| 5,179,728 A * | 1/1993 | Sowadski ................ 455/183.1 |
| 5,548,831 A | 8/1996 | Bijker et al. | |
| 5,809,409 A | 9/1998 | Itoh et al. | |
| 5,862,466 A | 1/1999 | Erickson | |
| 6,075,409 A * | 6/2000 | Khlat ........................ 329/304 |
| 6,148,047 A * | 11/2000 | Mohindra ................... 375/346 |
| 6,343,211 B1 * | 1/2002 | Thodesen et al. ........... 455/317 |
| 6,370,372 B1 * | 4/2002 | Molnar et al. .............. 455/323 |
| 6,449,471 B1 * | 9/2002 | Katsura et al. ............. 455/324 |
| 6,473,606 B1 | 10/2002 | Ecklund et al. | |
| 6,683,919 B1 | 1/2004 | Olgaard et al. | |
| 6,693,980 B1 | 2/2004 | Linder et al. | |
| 6,766,157 B1 * | 7/2004 | Hunzeker et al. ........... 455/317 |
| 6,856,794 B1 * | 2/2005 | Tso et al. .................... 455/260 |
| 6,868,128 B1 * | 3/2005 | Lane .......................... 375/319 |
| 6,901,249 B1 * | 5/2005 | Kobayashi .................. 455/333 |
| 7,054,610 B1 * | 5/2006 | Itoh et al. ................... 455/324 |

(Continued)

*Primary Examiner*—Simon D Nguyen

(57) ABSTRACT

There is disclosed a radio frequency (RF) demodulation circuit comprising: 1) a first RF mixer having a first input port for receiving an in-phase RF signal having a frequency of RF and a second input port for receiving an in-phase local oscillator (LO) signal having a frequency of LO, wherein LO is approximately equal to one-half of RF, and wherein the first RF mixer generates a first intermediate frequency (IF) signal having a frequency of LO; 2) a second RF mixer having a first input port for receiving an out-of-phase RF signal having a frequency of RF and a second input port for receiving an out-of-phase local oscillator (LO) signal having a frequency of LO, and wherein the second RF mixer generates a second intermediate frequency (IF) signal having a frequency of LO; and 3) a first signal combiner for combining the first and second IF signals to generate a composite IF signal, wherein the first signal combiner combines a first leakage signal from the first RF mixer and a second leakage signal from the second RF mixer such that the first and second leakage signals at least partially cancel each other to produce an output leakage signal that is less than either of the first and second leakage signals.

17 Claims, 2 Drawing Sheets

U.S. PATENT DOCUMENTS

2001/0040932 A1* 11/2001 Lindquist et al. ............ 375/346
2002/0123319 A1* 9/2002 Peterzell .................... 455/296
2002/0160738 A1* 10/2002 Allott et al. ................. 455/304
2004/0053586 A1* 3/2004 Simmons et al. ............ 455/130

* cited by examiner

RADIO FREQUENCY MIXER AND METHOD OF OPERATION

This application is a continuation of prior U.S. patent application Ser. No. 09/862,048 filed on May 21, 2001 now U.S. Pat. No. 6,839,551.

TECHNICAL FIELD OF THE INVENTION

The present invention is generally directed to radio frequency (RF) receivers and, in particular, to a zero image RF mixer optimized for use in a single chip radio receiver.

BACKGROUND OF THE INVENTION

Business and consumers use a wide array of wireless devices, including cell phones, wireless local area network (LAN) cards, global positioning system (GPS) devices, electronic organizers equipped with wireless modems, and the like. The increased demand for wireless communication devices has created a corresponding demand for technical improvements to such devices. Generally speaking, more and more of the components of conventional radio receivers and transmitters are being fabricated in a single integrated circuit (IC) package. In order to simplify single chip designs and to make each design suitable for as many applications as possible, much emphasis has been placed on developing direct conversion receivers and so-called "software-defined" radios.

Generally, the demodulation in these radios requires a single multiplication step to recover the transmitted baseband information. A mixer functions as the demodulator. However, a physical mixer also introduces signal leakages among its signal ports (RF input, LO input, and IF output). The signal leakages develop DC-offset levels that change dynamically when the operating environment of the receiver changes. As a result of these impairments, demodulation errors occur.

Many RF receiver designs implement control loops to track and compensate for the unwanted offset disturbances. However, many of these control loops are difficult and expensive to implement in a single integrated circuit package. Many designs require complicated image-rejection filters.

Therefore, there is a need in the art for improved RF receivers that are low cost, high performance and easily integrated into a single integrated circuit chip. In particular there is a need for a RF mixer that minimizes the amount of signal leakage introduced at the RF input port, the local oscillator input port and the intermediated frequency (IF) output port.

SUMMARY OF THE INVENTION

To address the above-discussed deficiencies of the prior art, it is a primary object of the present invention to provide an improved RF demodulation circuit that uses a two step mixing process to combat the impairments described above. The present invention has a simple architecture, but offers high level performance at low cost. No complicated image-rejection filters are required. Thus, an RF mixer according to the principles of the present invention is an ideal solution for manufacturing high volume radio frequency (RF) receivers on a single integrated circuit.

According to an advantageous embodiment of the present invention, there is provided a radio frequency (RF) demodulation circuit comprising: 1) a first RF mixer having a first input port capable of receiving an in-phase RF signal having a frequency of RF and a second input port capable of receiving an in-phase local oscillator (LO) signal having a frequency of LO, wherein LO is approximately equal to one-half of RF, and wherein the first RF mixer generates a first intermediate frequency (IF) signal having a frequency of LO; 2) a second RF mixer having a first input port capable of receiving an out-of-phase RF signal having a frequency of RF and a second input port capable of receiving an out-of-phase local oscillator (LO) signal having a frequency of LO, and wherein the second RF mixer generates a second intermediate frequency (IF) signal having a frequency of LO; and 3) a first signal combiner capable of combining the first and second IF signals to generate a composite IF signal, wherein the first signal combiner combines a first leakage signal from the first RF mixer and a second leakage signal from the second RF mixer such that the first and second leakage signals at least partially cancel each other to produce an output leakage signal that is less than either of the first and second leakage signals.

According to one embodiment of the present invention, the radio frequency demodulation circuit further comprising a first transformer having an input winding capable of receiving an incoming RF signal and an output winding capable of generating the in-phase RF signal and the out-of-phase RF signal.

According to another embodiment of the present invention, the radio frequency demodulation circuit further comprises a local oscillator capable of generating a reference local oscillator signal having the frequency of LO.

According to still another embodiment of the present invention, the radio frequency demodulation circuit further comprises a second transformer having an input winding capable of receiving the reference local oscillator signal and an output winding capable of generating the in-phase LO signal and the out-of-phase LO signal.

According to yet another embodiment of the present invention, the radio frequency demodulation circuit further comprises a bandpass filter having an input coupled to an output of the first signal combiner capable of receiving the composite IF signal and an output capable of outputting a filtered composite IF signal.

According to a further embodiment of the present invention, the bandpass filter has a low Q-value at the frequency of LO.

According to a still further embodiment of the present invention, the radio frequency demodulation circuit further comprises an IF mixer having a first input port capable of receiving the filtered composite IF signal having the frequency of LO and a second input port capable of receiving the reference local oscillator signal.

According to a yet further embodiment of the present invention, the IF mixer down-converts the filtered composite IF signal to thereby generate a first baseband signal.

In one embodiment of the present invention, the radio frequency demodulation circuit further comprises a second signal combiner capable of combining the first baseband signal and a DC cancellation signal to thereby generate a second baseband signal.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
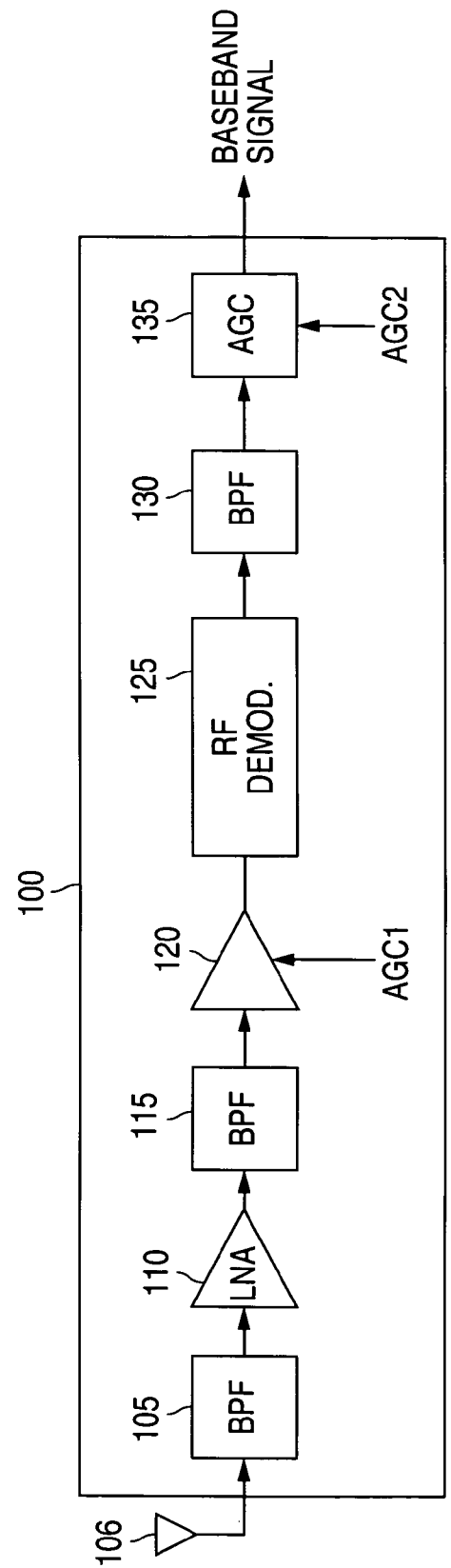
FIG. 1 illustrates selected portions of the receive signal path of an exemplary RF transceiver according to one embodiment of the present invention.
Figure 2:
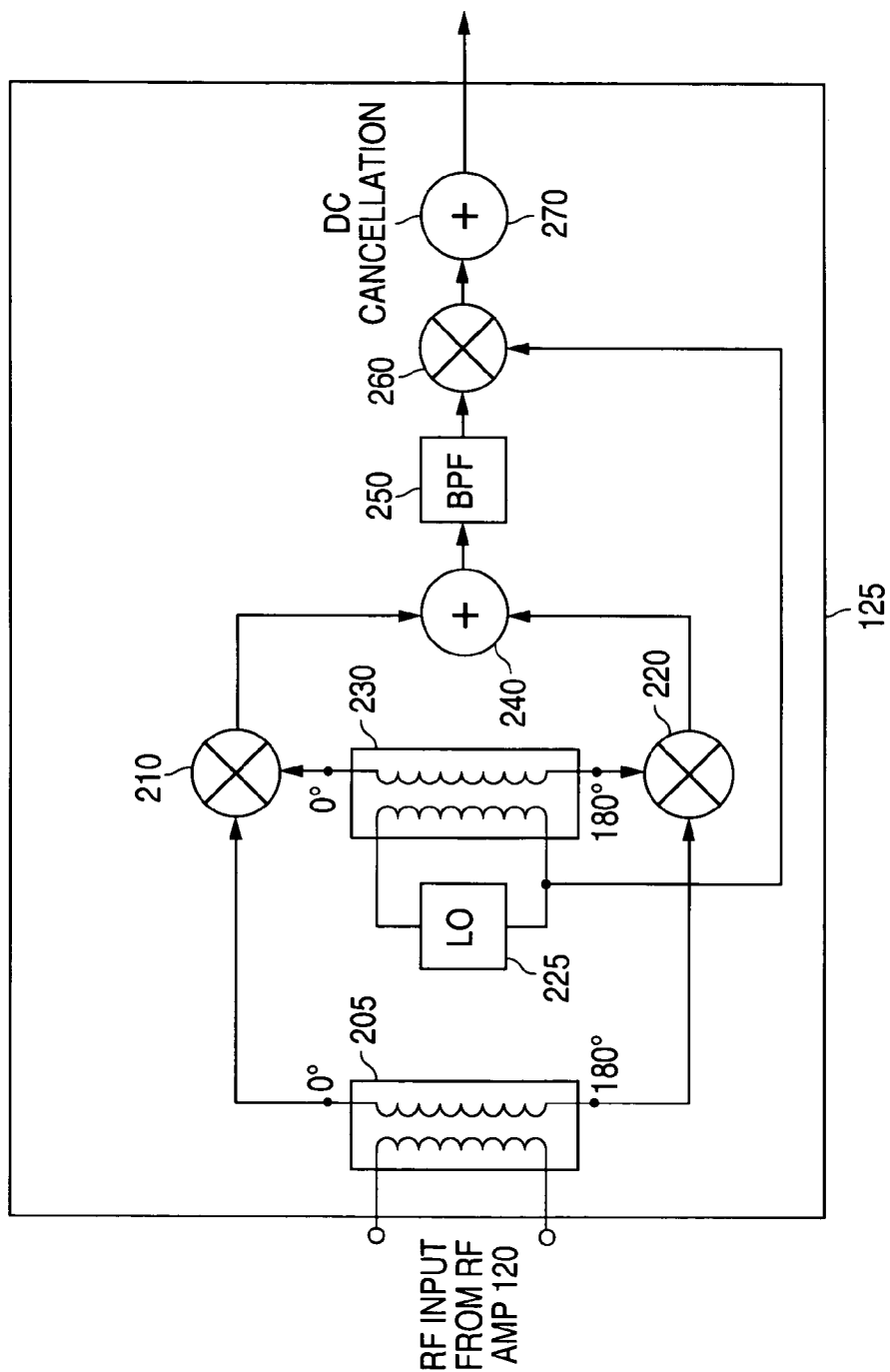
FIG. 2 illustrates selected portions of an improved radio frequency demodulator in the exemplary RF transceiver in FIG. 1 according to one embodiment of the present invention.

FIGS. 1 and 2, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged radio frequency (RF) receiver.

FIG. 1 illustrates selected portions of the receive signal path of exemplary RF receiver 100 according to one embodiment of the present invention. RF receiver 100 may be implemented in any conventional one-way or two-way RF communication device, including a cell phone, a wireless network card, a two-way pager, and the like. For the purpose of simplifying the explanation of the present invention, the transmitter portion of a two-way communication embodiment of the present invention is not shown.

The RF receive path through RF receiver 100 comprises band pass filter (BPF) 105, which receives an incoming RF signal from antenna 106. The RF receive path further comprises low-noise amplifier (LNA) 110, band pass filter (BPF) 115, RF amplifier 120, RF demodulator 125, band pass filter (BPF) 130, and automatic gain control (AGC) circuit 135.

BPF 105 isolates the frequencies of interest in the incoming RF signal from antenna 106 and filters out unwanted frequency bands. LNA 110 amplifies the filtered output of BPF 105 to an intermediate level. BPF 115 further filters the amplified output of LNA 110 to remove noise outside of the desired receiver frequency range that were amplified by, or introduced by, LNA 110. RF amplifier 120 further amplifies the output of BPF 115 by a variable amount of gain determined by the gain control signal AGC1. RF demodulator 125 down-converts the output of RF amplifier 120 by mixing it with a local oscillator reference signal. RF demodulator 125 effectively shifts the information signal centered around the receiver RF operating frequency down to a baseband signal.

At this point, the signal output by RF demodulator 125 may have spurious signals outside of the desired frequency range of the information signal which have been amplified and/or introduced by the RF demodulator 125. BPF 130 is an extremely narrow filter that blocks all but the desired frequencies of interest from reaching AGC 135. AGC circuit 135 further amplifies the filtered output of BPF 130 by a variable amount of gain determined by the gain control signal AGC2.

Those skilled in the art will recognize that, in alternate embodiments of the present invention, one or more of BPF 105, BPF 115, and BPF 130 may be other types of filters, including low pass filters. In particular, BPF 130 may be a low pass filter in an alternate embodiment. The choice of bandpass filters in the exemplary embodiment described above is by way illustration only and should not be construed so as to limit the scope of the present invention.

FIG. 2 illustrates selected portions of radio frequency demodulator 125 in exemplary RF receiver 100 according to one embodiment of the present invention. RF demodulator 125 comprises transformer 205, RF mixer 210, RF mixer 220, local oscillator (LO) 225, transformer 230, signal combiner 240, bandpass filter 250, IF mixer 260, and signal combiner 270. Transformer 205 receives on its primary windings an RF input signal from the output of RF amplifier 120. On its output windings, RF transformer 205 generates a 0° phase shifted RF output signal (i.e., in-phase RF output) on a first output terminal and a 180° phase shifted RF output signal (i.e., out-of-phase RF output) on a second output terminal. The in-phase RF output signal is applied to a first input port of RF mixer 210. The out-of-phase RF output signal is applied to a first input port of RF mixer 220.

Local oscillator (LO) 225 generates a LO reference signal at one half the frequency of the RF input signal received by transformer 205. For instance, if the operating frequency of RF receiver 100 is 2.4 gigahertz (GHz), the RF input signal on the primary windings of transformer 205 is also at 2.4 GHz and LO 225 and generates a LO reference signal at 1.2 Ghz. The LO reference signal is applied to the primary windings of RF transformer 230. On its output windings, RF transformer 230 generates a 0° phase shifted LO output signal (i.e., in-phase LO output) on a first output terminal and a 180° phase shifted LO output signal (i.e., out-of-phase LO output) on a second output terminal. The in-phase LO output signal is applied to a second input port of RF mixer 210. The out-of-phase LO output signal is applied to a second input port of RF mixer 220.

RF mixer 210 produces an intermediate frequency output signal at RF−LO=IF. Since LO=(RF)/2, the IF frequency also equals (RF)/2. In the example given above, where RF=2.4 GHz and LO=1.2 GHz, the IF frequency equals 1.2 Ghz. Similarly, RF mixer 220 produces an intermediate frequency output signal at RF−LO=IF. Since RF mixer 210 receives the in-phase RF input signal and the in-phase LO input signal and RF mixer 220 receives the out-of-phase RF input signal and the out-of-phase LO input signal, the IF output signal from RF mixer 210 and the IF output signal from RF mixer 220 are in phase with each other. However, the leakage signals in the IF output signals from RF mixer 210 and RF mixer 220 caused by the in-phase and out-of-phase LO reference signals are not in phase with each other.

Because the IF output signal from RF mixer 210 and the IF output signal from RF mixer 220 are in phase with each other, signal combiner 240 adds the two IF output signals together to produce a larger composite IF output signal. However, since the leakage signals in the IF outputs from RF mixer 210 and RF mixer 220 are out of phase with each other, signal combiner 240 subtracts the two leakage signals to effectively cancel the leakage signals in the composite IF output signal on the output of signal combiner 240.

BPF 250 filters the composite IF output signal from signal combiner 240 to isolated the frequencies of interest at the LO frequency (e.g., 1.2 Ghz). BPF 250 has a low Q value at the LO frequency. The filtered composite IF output signal is applied to a first input port of IF mixer 260. The 180° phase shifted LO output signal (i.e., out-of-phase LO output) from LO 225 is applied to the second input port of IF mixer 260. It should be noted that there is no requirement that the 180° phase shifted LO output signal from LO 225 be used. In an alternative embodiment of the present invention, the 0° phase shifted LO output signal (i.e., the in-phase LO output) from LO 225 may be used by IF mixer 260.

IF mixer 260 produces an image signal at IF−LO. Since IF=LO, the output of IF mixer 260 is only the baseband signal with a small DC component. Signal combiner 270 receives the baseband signal on a first input port and a DC CANCELLATION signal on a second input port. The DC CANCELLATION signal effectively cancels the small DC component in the baseband signal. The control circuitry for generating the DC CANCELLATION signal is not shown for purposes of simplicity. Any convention DC cancellation feedback control loop is suitable for this purpose.

Furthermore, it should be noted that there is no requirement that transformers be used to produce the in-phase RF output signal, the out-of-phase RF output signal, the in-phase LO output signal, and the out-of-phase LO output signal. Transformers 205 and 230 were selected for the purpose of illustration only. In alternate embodiments of the present invention, other types of circuits, including differential amplifiers, may be used to produce 0° phase shifted RF and LO output signals and 180° phase shifted RF and LO output signals.

An RF demodulation circuit according to the principles of the present invention provides very good spurious noise and image rejection. It also is inexpensive to fabricate and is therefore very suitable for single-chip radio devices. Because the local oscillator runs at one-half the frequency of the RF frequency, an RF demodulation circuit according to the principles of the present invention is a relatively low power device. It also has low local oscillator-to-antenna leakage.

Although the present invention has been described in detail, those skilled in the art should understand that they can make various changes, substitutions and alterations herein without departing from the spirit and scope of the invention in its broadest form.

What is claimed is:

1. A circuit, comprising:
    a first mixer capable of receiving an in-phase radio frequency signal and an in-phase reference signal and generating a first intermediate frequency signal, the first intermediate frequency signal comprising a first leakage signal, wherein a frequency of the in-phase reference signal is approximately one-half of a frequency of the in-phase radio frequency signal, and a frequency of the first intermediate frequency signal is approximately one-half of the frequency of the in-phase radio frequency signal;
    a second mixer capable of receiving an out-of-phase radio frequency signal and an out-of-phase reference signal and generating a second intermediate frequency signal, the second intermediate frequency signal comprising a second leakage signal;
    a signal combiner capable of receiving the first and second intermediate frequency signals and generating a composite intermediate frequency signal, the composite intermediate frequency signal comprising an output leakage signal that is less than either of the first and second leakage signals;
    a filter capable of receiving the composite intermediate frequency signal and generating a filtered composite intermediate frequency signal;
    a third mixer capable receiving the filtered composite intermediate frequency signal and a local oscillation signal and generating a baseband signal with a direct current component; and
    a second signal combiner capable of receiving the baseband signal and a direct current cancellation signal and at least partially reducing the direct current component in the baseband signal.

2. The circuit of claim 1, wherein:
    the first and second intermediate frequency signals are in-phase with each other; and
    the first and second leakage signals are not in-phase with each other.

3. The circuit of claim 1, further comprising:
    a local oscillator capable of generating a local oscillation signal, the in-phase reference signal and the out-of-phase reference signal associated with the local oscillation signal.

4. The circuit of claim 3, further comprising:
    a first transformer capable of receiving an incoming radio frequency signal and generating the in-phase radio frequency signal and the out-of-phase radio frequency signal; and
    a second transformer capable of receiving the local oscillation signal and generating the in-phase reference signal and the out-of-phase reference signal.

5. The circuit of claim 1, wherein the in-phase reference signal and the out-of-phase reference signal are associated with the local oscillation signal.

6. A receiver, comprising:
    a front-end capable of receiving an incoming radio frequency signal; and
    a demodulator comprising:
        a first mixer capable of receiving an in-phase radio frequency signal and an in-phase reference signal and generating a first intermediate frequency signal, the first intermediate frequency signal comprising a first leakage signal, wherein a frequency of the in-phase reference signal is approximately one-half of a frequency of the in-phase radio frequency signal and a frequency of the first intermediate frequency signal is approximately one-half of the frequency of the in-phase radio frequency signal;
        a second mixer capable of receiving an out-of-phase radio frequency signal and an out-of-phase reference signal and generating a second intermediate frequency signal, the second intermediate frequency signal comprising a second leakage signal;
        a signal combiner capable of receiving the first and second intermediate frequency signals and generating a composite intermediate frequency signal, the composite intermediate frequency signal comprising an output leakage signal that is less than either of the first and second leakage signals;

a filter capable of receiving the composite intermediate frequency signal and generating a filtered composite intermediate frequency signal;

a third mixer capable receiving the filtered composite intermediate frequency signal and a local oscillation signal and generating a baseband signal with a direct current component; and a second signal combiner capable of receiving the baseband signal and a direct current cancellation signal and at least partially reducing the direct current component in the baseband signal.

7. The receiver of claim 6, wherein:
the first and second intermediate frequency signals are in-phase with each other; and
the first and second leakage signals are not in-phase with each other.

8. The receiver of claim 6, wherein the demodulator further comprises:
a local oscillator capable of generating a local oscillation signal;
a first transformer capable of receiving the incoming radio frequency signal and generating the in-phase radio frequency signal and the out-of-phase radio frequency signal; and
a second transformer capable of receiving the local oscillation signal and generating the in-phase reference signal and the out-of-phase reference signal.

9. The receiver of claim 6, wherein the front-end comprises:
a first filter capable of receiving the incoming radio frequency signal from an antenna and filtering the incoming radio frequency signal;
a first amplifier capable of receiving and amplifying an output of the first filter;
a second filter capable of receiving and filtering an output of the first amplifier; and
a second amplifier capable of receiving an output of the second filter and amplifying the output of the second filter by an adjustable amount of gain.

10. The receiver of claim 9, further comprising:
a third filter capable of receiving a baseband signal generated by the demodulator and filtering the baseband signal; and
a third amplifier capable of receiving an output of the third filter and amplifying the output of the third filter by a second adjustable amount of gain.

11. The receiver of claim 6, wherein the in-phase reference signal and the out-of-phase reference signal are associated with the local oscillation signal.

12. A method, comprising:
generating a first intermediate frequency signal using an in-phase radio frequency signal and an in-phase reference signal, the first intermediate frequency signal comprising a first leakage signal, wherein a frequency of the in-phase reference signal is approximately one-half of a frequency of the in-phase radio frequency signal, and a frequency of the first intermediate frequency signal is approximately one-half of the frequency of the in-phase radio frequency signal;

generating a second intermediate frequency signal using an out-of-phase radio frequency signal and an out-of-phase reference signal, the second intermediate frequency signal comprising a second leakage signal;

generating a composite intermediate frequency signal using the first and second intermediate frequency signals, the composite intermediate frequency signal comprising an output leakage signal that is less than either of the first and second leakage signals;

filtering the composite intermediate frequency signal to generate a filtered composite intermediate frequency signal;

mixing the filtered composite intermediate frequency signal and a local oscillation signal to produce a baseband signal with a direct current component; and combining the baseband signal and a direct current cancellation signal to at least partially reduce the direct current component in the baseband signal.

13. The method of claim 12, wherein:
generating the first intermediate frequency signal comprises mixing the in-phase radio frequency signal and the in-phase reference signal;
generating the second intermediate frequency signal comprises mixing the out-of-phase radio frequency signal and the out-of-phase reference signal; and
generating the composite intermediate frequency signal comprises combining the first and second intermediate frequency signals.

14. The method of claim 12, wherein:
the first and second intermediate frequency signals are in-phase with each other; and
the first and second leakage signals are not in-phase with each other.

15. The method of claim 12, further comprising:
generating a local oscillation signal, the in-phase reference signal and the out-of-phase reference signal associated with the local oscillation signal.

16. The method of claim 15, further comprising:
generating the in-phase radio frequency signal and the out-of-phase radio frequency signal using an incoming radio frequency signal; and
generating the in-phase reference signal and the out-of-phase reference signal using the local oscillation signal.

17. The method of claim 12, wherein the in-phase reference signal and the out-of-phase reference signal are associated with the local oscillation signal.

* * * * *

UNITED STATES PATENT AND TRADEMARK OFFICE
CERTIFICATE OF CORRECTION

PATENT NO. : 7,636,562 B1  Page 1 of 1
APPLICATION NO. : 11/027772
DATED : December 22, 2009
INVENTOR(S) : Hee Wong It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1204 days.

Signed and Sealed this

Twenty-first Day of December, 2010

David J. Kappos
*Director of the United States Patent and Trademark Office*